United States Patent
Angelopoulos et al.

(10) Patent No.: US 6,908,684 B2
(45) Date of Patent: *Jun. 21, 2005

(54) PROMOTING ADHESION BETWEEN A POLYMER AND A METALLIC SUBSTRATE

(75) Inventors: Anastasios P. Angelopoulos, Dunstable, MA (US); Stephen Joseph Fuerniss, deceased, late of Endicott, NY (US); by Joan Cangelosi, legal representative, Endicott, NY (US); Joseph Alphonse Kotylo, Binghamton, NY (US); Luis Jesus Matienzo, Endicott, NY (US); Norman L. Shaver, Tuscon, AZ (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/790,673

(22) Filed: Mar. 3, 2004

(65) Prior Publication Data

US 2004/0166438 A1 Aug. 26, 2004

Related U.S. Application Data

(62) Division of application No. 09/322,132, filed on May 27, 1999, now Pat. No. 6,730,409.

(51) Int. Cl.⁷ ............................................... B32B 15/08
(52) U.S. Cl. ..................... 428/457; 428/458; 428/461
(58) Field of Search ................................ 428/457, 458, 428/461

(56) References Cited

U.S. PATENT DOCUMENTS

| | | |
|---|---|---|
| 3,484,270 A | 12/1969 | Sambeistre et al. |
| 3,511,661 A | 5/1970 | Rauner et al. |
| 3,808,028 A | 4/1974 | Lando |
| 3,836,437 A | 9/1974 | Osada et al. |
| 3,837,928 A | 9/1974 | Morrison |
| 3,953,309 A | 4/1976 | Gilano et al. |
| 4,054,095 A | 10/1977 | Morrow |
| 4,199,491 A | 4/1980 | Inayoshi et al. |
| 4,448,804 A | 5/1984 | Amelio et al. |
| 4,457,977 A | 7/1984 | Walles |
| 4,478,883 A | 10/1984 | Bupp et al. |
| 4,525,390 A | 6/1985 | Alpaugh et al. |
| 4,554,182 A | 11/1985 | Bupp et al. |
| 4,578,342 A | 3/1986 | Sekiya |
| 4,640,886 A | 2/1987 | Miller et al. |
| 4,761,212 A | 8/1988 | Watanabe et al. |
| 4,832,989 A | 5/1989 | Giesecke et al. |
| 4,894,313 A | 1/1990 | Neumann et al. |
| 4,971,891 A | 11/1990 | Kawamura et al. |
| 5,024,858 A | 6/1991 | Burch |
| 5,047,309 A | 9/1991 | Koike et al. |
| 5,151,304 A | 9/1992 | Lee |
| 5,153,024 A | 10/1992 | Schutyser |
| 5,238,747 A | 8/1993 | Schmidt et al. |
| 5,279,899 A | 1/1994 | Asrar |
| 5,288,377 A | 2/1994 | Johnson et al. |
| 5,354,593 A | 10/1994 | Grandmont et al. |
| 5,597,677 A | 1/1997 | Kangas et al. |
| 5,635,239 A | 6/1997 | Chen et al. |
| 5,698,268 A | 12/1997 | Takagi et al. |
| 5,935,652 A | 8/1999 | Angelopoulos et al. |
| 6,014,929 A | 1/2000 | Teng |
| 6,114,089 A | 9/2000 | Takita et al. |

*Primary Examiner*—Monique R. Jackson
(74) *Attorney, Agent, or Firm*—Connolly Bove Lodge & Hutz LLP

(57) ABSTRACT

A structure comprising a metallic surface, a layer of a polymeric material and a water soluble polymeric material located between the metallic surface and the layer of polymeric material, and process of fabricating such are provided. The structure exhibits enhanced adhesion between the metallic surface and the polymeric material.

10 Claims, No Drawings

PROMOTING ADHESION BETWEEN A POLYMER AND A METALLIC SUBSTRATE

REFERENCE TO RELATED APPLICATION

This is a division of application Ser. No. 09/322,132, filed May 27, 1999, now U.S. Pat. No. 6,730,409; issued May 4, 2004.

TECHNICAL FIELD

The present invention relates to improving the adhesion of a polymer to an underlying substrate and especially to an underlying metallic substrate such as copper.

BACKGROUND OF INVENTION

In the manufacture of printed circuit cards and boards, a dielectric sheet material is employed as the substrate. A conductive circuit pattern is provided on one or both of the major surfaces of the substrate.

A conductive pattern can be formed on the surface of the substrate using a variety of known techniques. These known techniques include the subtractive technique and the additive technique. In the subtractive technique, a blanket layer of copper on the substrate is selectively etched to form the desired circuit pattern. It is well known to etch a pattern in the metallic surface such as copper by applying to the surface a photoresist, exposing the photoresist through a pattern of actinic radiation, removing the exposed or unexposed portion of the resist depending upon the type of resist to expose the underlying metal, and then etching the exposed metal with a suitable etchant. In the additive process, typically the photoresist is applied to the surface of the substrate, followed by being exposed through a pattern to actinic radiation and removing the exposed or unexposed portions of the resist depending upon the type of resist employed to expose the underlying substrate and the desired circuitry to be subsequently provided. Next, the exposed substrate is typically coated with a metallic layer such as copper from an electroless plating bath followed by electroplating to achieve the desired line thickness.

However, the bond of the photoresist or photoactive layer to the metal surface has not always been adequate, especially for exposure to various plating baths and/or etching compositions. However, as can be appreciated, the adhesion of photoresists to the underlying metallic surface is critical not only in fine-line subtractive circuitization, but also in other photoresist-based manufacturing processes such as pattern electroplating and solder mask applications. In solder mask applications, a photoactive polymeric solder mask is applied and defined by photolithographic techniques to uncover those underlying portions whereby solder is to be deposited while protecting other areas from having the solder deposit.

In view of the adhesion problems between these polymers and underlying metallic surfaces, a number of surface texturing/screening processes have been suggested for enhancing such adhesion. Some examples include providing pumice on foil copper to roughen its surface in the case of subtractive circuitization, sulfuric acid pretreatment of additive copper surfaces in the case of Sn/Pb electroplating, copper oxide treatment of copper in the case of certain solder mask applications, and vapor blast treatment of gold in the case of certain solder mask applications to chip carriers.

However, despite the attempts to enhance adhesion, failures which in turn result in the scrapping of product still occurs periodically. The adhesion existing between photoactive polymers and underlying metallic substrates remains borderline, at most, in many cases. For instance, it has been observed that the interface between additive copper and various photoresists is susceptible to separation during immersion tin and subsequent Sn/Pb electroplating due to increased immersion times, photoresist mis-registration, and rinse impurities that might be present in the sulfuric acid pre-clean prior to applying the resist.

Accordingly, the need remains for providing enhanced adhesion between photoactive polymers and metallic surfaces in order to yield more robust as well as potentially more cost-effective, photoactive-based processes.

SUMMARY OF INVENTION

The present invention provides for improved bonding of polymers to metallic surfaces. It has been found according to the present invention that polymers can be firmly and adherently bound to the desired metallic surface by employing a water soluble polymeric material, which prevents "curling" or lifting of the other polymer from the metallic surface and, consequently, prevents undercutting during etching in the case of photoactive polymers.

In particular, the adhesion between the polymer and metallic surface is enhanced by providing a layer of a water soluble polymeric material between the polymer and the metal surface. Specifically, the present invention is directed to a structure which comprises a metallic surface, a layer of a first polymeric material and a water soluble polymeric material located between the metallic surface and the layer of the first polymeric material.

The present invention is also directed to a process for fabricating the above structure which comprises the steps of providing a metallic surface, providing a water soluble polymeric material on the metallic surface and providing a layer of a polymeric material on the water soluble polymeric material.

In addition, the present invention relates to an electronic package that comprises a substrate, a metallic conductive layer on the substrate, a water soluble polymeric material on the metallic conductive layer and a polymeric layer located on the water soluble polymeric material wherein the polymeric layer has been developed to provide a pattern corresponding to desired circuitry.

The present invention also relates to a process for fabricating the above-defined electronic package which comprises providing a substrate and a metallic conductive layer on the substrate, providing a water soluble polymeric material located on the conductive layer, providing a photoactive polymeric film on the water soluble polymeric material, imagewise exposing the photoactive polymeric material to actinic light, and developing by removing photoactive film.

Still other objects and advantages of the present invention will become readily apparent by those skilled in the art from the following detailed description, wherein it is shown and described only the preferred embodiments of the invention, simply by way of illustration of the best mode contemplated of carrying out the invention. As will be realized the invention is capable of other and different embodiments, and its several details are capable of modifications in various obvious respects, without departing from the invention. Accordingly, the description is to be regarded as illustrative in nature and not as restrictive.

BEST AND VARIOUS MODES FOR CARRYING OUT INVENTION

The present invention relates to improving the adhesion of polymeric materials and especially photoactive polymeric materials to a variety of metallic conductive surfaces. Examples of suitable metals include copper, gold, aluminum, silver, alloys of these metals and conductive metallic compounds such as metallic silicides and titanates. Other suitable metals include titanium, niobium, tantalum and tungsten. The preferred metal is copper and copper alloys such as copper aluminum alloys.

In a typical structure, the metallic conductive layer is present on an underlying substrate such as a dielectric substrate. Typical dielectric substrates employed in fabricating printed circuit cards and boards include thermoplastic and thermosetting resins. Typical thermosetting polymeric materials include epoxy, phenolic base materials and polyamides. The dielectric material may be molded articles of the polymers containing fillers and/or reinforcing agents such as glass filled epoxy or phenolic based materials. Examples of some suitable thermoplastic polymeric materials include polyolefins such as polypropylene, polysulfones, polycarbonates, nitrile rubbers and ABS polymers.

In accordance with the present invention, the metallic surface is treated or coated with a water soluble polymeric material. The water soluble polymers employed according to the present invention typically have weight average molecular weights of at least about 100,000 and more typically about 500,000 to about 1,000,000. The water soluble polymeric materials include both ionic polymeric materials and non-ionic polymeric materials. Examples of some suitable water soluble polymeric materials include polymers of acrylamides, amidoamines and acrylic acids. The polymers include homopolymers and copolymers. The cationic polyacrylamides typically include at least two active or available cationic functional moieties such as quaternary phosphonium and quaternary ammonium groups. Suitable cationic polyacrylamide is commercially available under the trade designation Polytec 7M from Polyset, Inc. Another cationic polymer commercially available is a cationic polyamidoamine under the trade designation Cartaretin available from Sandoz Chemicals. A commercially available non-ionic polyacrylamide is available under the trade designation Polytec 31 PX from Polytec, Inc.

The polymers are typically applied to the metallic surface as a dilute aqueous solution of about 0.005 to about 5% by weight and more typically about 0.03 to about 0.7% by weight of the polymer. The aqueous solution also typically contains an acid such as sulfuric acid or hydrochloric acid to provide a pH value of usually up to about 3, more usually up to about 2 and preferably about 0 to about 1. The low pH values are preferred in order to obtain a relatively low viscosity for the polymer solution to thereby facilitate applying it. The acid is generally present in amounts of about 0.001 N to about 1 N.

The treatment with the water soluble polymer generally requires about 1 to about 10 Minutes and more typically about 2 to about 4 Minutes. The water soluble polymeric material provides a more hydrophilic surface on the metallic surface. The water soluble polymeric material can be a monolayer or even less than a monolayer whereby the water soluble polymer does not coat the entire metallic surface but at least 25% of the surface.

A typical composition is employed at about 0.6 grams/liter of Polytec 7M in an aqueous sulfuric acid solution at a pH between 0 and 1.

The water soluble polymers are significantly more hydrophilic than the other polymers such as the photoactive polymeric materials which are not water soluble and enhances its hydrophilic nature whether the photoactive polymeric materials are hydrophobic or hydrophilic. The water soluble polymers in solid form have a contact angle with water of zero, whereas the photoactive polymers or other polymers employed have a contact angle with water greater than zero.

The photoactive polymeric material includes those used in photoresist based processes such as subtractive techniques, patterned electroplating, and solder mask applications. The photoactive polymers can be hydrophilic polymers and include acrylate and methacrylate based photoactive polymers including epoxy-acrylate and/or epoxy-methacrylate mixtures. Typically, these polymers are from polymethylmethacrylate along with a poly-functional hydrophilic acrylate ester. Suitable commercially available photoactive polymers include CFI, MI, Platemaster, T168, and Vacrel. Vacrel is an example of a dry film photoresist that finds especial utility as a solder mask. In a typical process, the photoactive material is subjected imagewise to a suitable actinic light pattern. Depending upon whether the photoactive material is a positive photoactive material or a negative active material, either the exposed or unexposed regions respectively will be removed with a suitable solvent for developing the desired pattern. After this, the pattern of the metallic conductive layer can then be provided either by subtractive or additive plating, depending upon the technique being employed. Subsequent to forming the desired conductive pattern, the remaining photoresist and water soluble polymer are then removed employing suitable solvents.

The following non-limiting examples are presented to further illustrate the present invention.

EXAMPLE 1

A dielectric substrate containing additive copper surfaces is immersed into a 0.6 gram/liter aqueous solution of Polytec 7M in sulfuric acid at a pH between 0 and 1.

The surfaces were precleaned with sulfuric acid followed by laminating photoresist onto the surfaces. The lamination is conducted at pressures of about 20 to about 40 psi, temperatures of about 205° C. to about 215° C. at a rate of about 2 Meters per minute. The photoresists employed are CFI, MI and Platemaster. The different surfaces with the different resists are then exposed to a typical pattern and then developed employing an aqueous solution of about 0.8% by weight of sodium carbonate at a temperature of about 82° F. and sprayed at a pressure of about 20 psi. Next, the parts are then subjected to an immersion Sn and Sn/Pb electroplating process.

COMPARISON EXAMPLE A

The above process is carried out except that the cationic polyacrylamide solution is not employed.

Upon testing, it is determined that the parts treated with the above cationic polyacrylamide materials in Example 1 withstand significantly greater immersion times prior to resist lifting than the control parts that were processed without the polyacrylamide as in Comparison Example A.

EXAMPLE 2

Example 1 is repeated except that a cationic polyamidoamine (Cartaretin) is employed in place of the above-mentioned cationic polyacrylamides. The results obtained are similar to those obtained with the above cationic polyacrylamides of Example 1.

EXAMPLE 3

Example 1 is repeated except that a non-ionic polyacrylamide (Polytec 31PX) is employed in place of the cationic polyacrylamide of Example 1. The results obtained are similar to those of Example 1.

EXAMPLE 4

Example 1 is repeated except that the photoactive material is Vacrel. The results obtained are similar to those obtained when treating copper with an oxidized copper layer. However, the procedure according to the present invention is a less expensive and more facile procedure to carry out.

The foregoing description of the invention illustrates and describes the present invention. Additionally, the disclosure shows and describes only the preferred embodiments of the invention but, as mentioned above, it is to be understood that the invention is capable of use in various other combinations, modifications, and environments and is capable of changes or modifications within the scope of the inventive concept as expressed herein, commensurate with the above teachings and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. An apparatus comprising:

a dielectric substrate;

a metallic surface on said dielectric substrate;

a layer of a first polymer provided on said metallic surface, said first polymer being a water-soluble, cationic material having a weight average molecular weight of at least about 100,000; and a layer of a second polymer provided on said first polymer, said second polymer being a non-water-soluble material.

2. The apparatus of claim 1, wherein said metallic surface is selected from the group consisting of copper, gold, aluminum, silver, titanium, tantalum, tungsten, niobium, alloys thereof, silicides thereof, and intermetallic compounds thereof.

3. The apparatus of claim 1, wherein said metallic surface is copper.

4. The apparatus of claim 1, wherein said metallic surface is gold.

5. The apparatus of claim 1, wherein said second polymer is selected from the group consisting of polymers of acrylates and methacrylates.

6. The apparatus of claim 1, wherein said first polymer is selected from the group consisting of polymers of acrylamides and amidoamines.

7. The apparatus of claim 1, wherein said first polymer has a weight average molecular weight of from about 500,000 to about 1,000,000.

8. The apparatus of claim 1, wherein said layer of a first polymer is a monolayer.

9. The apparatus of claim 1, wherein said layer of a first polymer is less than a monolayer.

10. The apparatus of claim 1, wherein said layer of a first polymer covers at least 25% of said metallic surface.

* * * * *